(12) United States Patent
Cheng et al.

(10) Patent No.: US 11,430,690 B2
(45) Date of Patent: *Aug. 30, 2022

(54) INTERCONNECTS HAVING AIR GAP SPACERS

(71) Applicant: International Business Machines Corporation, Armonk, NY (US)

(72) Inventors: Kenneth Chun Kuen Cheng, Shatin (HK); Koichi Motoyama, Clifton Park, NY (US); Oscar van der Straten, Guilderland Center, NY (US); Joseph F. Maniscalco, Lake Katrine, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

This patent is subject to a terminal disclaimer.

(21) Appl. No.: 17/133,975

(22) Filed: Dec. 24, 2020

(65) Prior Publication Data

US 2021/0118722 A1    Apr. 22, 2021

Related U.S. Application Data

(63) Continuation of application No. 16/576,236, filed on Sep. 19, 2019, now Pat. No. 10,950,493.

(51) Int. Cl.
*H01L 21/768*    (2006.01)
*H01L 21/764*    (2006.01)
(Continued)

(52) U.S. Cl.
CPC ........ *H01L 21/7682* (2013.01); *H01L 21/764* (2013.01); *H01L 21/76802* (2013.01);
(Continued)

(58) Field of Classification Search
CPC .............. H01L 21/7682; H01L 21/764; H01L 21/76802; H01L 23/49827;
(Continued)

(56) References Cited

U.S. PATENT DOCUMENTS 4,536,951 A    8/1985  Rhodes et al.
5,693,568 A    12/1997 Liu et al.
(Continued)

OTHER PUBLICATIONS

K.M. Vaeth et al., "Transistion Metals for Selective Chemical Vapor Depostion of Parylene-Based Polymers," Chem. Mater., 2000, pp. 1305-1313, vol. 12.
(Continued)

*Primary Examiner* — Matthew L Reames
(74) *Attorney, Agent, or Firm* — L. Jeffrey Kelly; Ryan, Mason & Lewis, LLP

(57) ABSTRACT

A semiconductor structure includes a substrate. A first metallization layer is disposed on the substrate. A second metallization layer is disposed on the first metallization layer and having one or more openings, wherein at least one of the one or more openings is configured to expose a top surface of the first metallization layer. A polymer-adhering liner layer is disposed on sidewalls of the at least one of the one more openings in the second metallization layer. A dielectric polymer is disposed in the at least one of the one or more openings in the second metallization layer and on the polymer-adhering liner layer. The dielectric polymer is configured to seal an air gap in the dielectric polymer.

20 Claims, 11 Drawing Sheets

(51) Int. Cl.
  *H01L 29/06* (2006.01)
  *H01L 23/532* (2006.01)
  *H01L 23/498* (2006.01)

(52) U.S. Cl.
  CPC .. *H01L 23/49827* (2013.01); *H01L 23/49838* (2013.01); *H01L 23/53214* (2013.01); *H01L 23/53228* (2013.01); *H01L 23/53257* (2013.01); *H01L 29/0649* (2013.01)

(58) Field of Classification Search
  CPC ......... H01L 23/49838; H01L 23/53214; H01L 23/53228; H01L 23/53257; H01L 29/0649
  See application file for complete search history.

(56) References Cited

U.S. PATENT DOCUMENTS

| | | |
|---|---|---|
| 6,444,565 B1 | 9/2002 | Feild et al. |
| 6,930,034 B2 | 8/2005 | Colburn et al. |
| 7,094,669 B2 | 8/2006 | Bu et al. |
| 7,256,127 B2 | 8/2007 | Gallagher et al. |
| 7,361,991 B2 | 4/2008 | Saenger et al. |
| 8,071,459 B2 | 12/2011 | Braeckelmann et al. |
| 9,305,882 B2 | 4/2016 | Nitta et al. |
| 9,607,881 B2 | 3/2017 | Liu et al. |
| 9,613,861 B2 | 4/2017 | Anderson et al. |
| 10,950,493 B1 * | 3/2021 | Cheng ............... H01L 23/53214 |
| 2002/0155693 A1 | 10/2002 | Hong et al. |
| 2015/0056800 A1 | 2/2015 | Mebarki et al. |

OTHER PUBLICATIONS

List of IBM Patents or Patent Applications Treated as Related.

\* cited by examiner

INTERCONNECTS HAVING AIR GAP SPACERS

BACKGROUND

With the current trends in IC miniaturization, and increasingly smaller critical dimensions, it is desirable in semiconductor device technology to integrate many different functions on a single chip. In the IC chip fabrication industry, there are three sections referred to in a typical IC chip build: front-end-of-line (FEOL), back-end-of-line (BEOL) and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

The FEOL transistor devices are typically processed using single crystal and poly-crystalline silicon. The BEOL interconnects are typically made of multiple metals; the bulk of the conductor is copper. If copper diffuses into the FEOL silicon-based devices, it can cause shorting or alter sensitive transistor characteristics and render the semiconductor useless. This is the reason for the MOL connection. BEOL generally begins when the first layer of metal is deposited on the wafer. BEOL includes contacts, insulating layers (dielectrics), metal levels, and bonding sites for chip-to-package connections.

SUMMARY

According to an exemplary embodiment of the present invention, a method for fabricating a semiconductor structure device includes forming a metallization layer on a substrate. The method further comprises forming a dielectric layer on the metallization layer. The method further comprises forming one or more openings in the dielectric layer and exposing a top surface of the metallization layer. The method further comprises forming a polymer-adhering liner layer on sidewalls of the dielectric layer and on the top surface of the metallization layer in the one or more first openings. The method further comprises removing the dielectric layer and the metallization layer to form one or more second openings and exposing a top surface of the substrate. The method further comprises selectively depositing a dielectric polymer in at least a top portion of the one or more second openings and on the polymer-adhering liner layer. The dielectric polymer seals an air gap positioned between a bottom surface of the dielectric polymer and the top surface of the substrate.

According to an exemplary embodiment of the present invention, a method for fabricating a semiconductor structure device includes forming a metallization layer on a substrate. The method further comprises forming an etch stop layer on the metallization layer. The method further comprises forming a dielectric layer on the metallization layer. The method further comprises forming a hardmask on the dielectric layer. The method further comprises patterning and forming a plurality of vias through the hardmask, the dielectric layer and the etch stop layer and exposing a top surface of the metallization layer. The method further comprises forming a polymer-adhering liner layer on sidewalls of the plurality of vias. The method further comprises depositing a conductive metal in each of the plurality of vias. The method further comprises forming a lithography material on a top surface of the polymer-adhering liner layer and the conductive metal in the plurality of vias and on a top surface of the hardmask disposed between adjacent vias. The method further comprises forming one or more first openings by selectively etching exposed portions of the hardmask, the dielectric layer, the etch stop layer and the metallization layer to expose the substrate. The method further comprises removing the lithography material and selectively etching the hardmask and the dielectric layer between the adjacent vias to form a second opening exposing the etch stop layer. The method further comprises selectively depositing a dielectric polymer in at least a top portion of the one or more first openings and on the polymer-adhering liner layer. The dielectric polymer seals an air gap positioned between a bottom surface of the dielectric polymer and a top surface of the substrate.

According to an exemplary embodiment of the present invention, a semiconductor structure includes a substrate. The semiconductor structure further comprises a metallization layer disposed on the substrate. The semiconductor structure further comprises one or more openings in the metallization layer, the one or more openings configured to expose a top surface of the substrate. A polymer-adhering liner layer is disposed on the metallization layer. The semiconductor structure further comprises a dielectric polymer disposed above a top portion of the one or more openings and on the polymer-adhering liner layer. The dielectric polymer seals an air gap positioned between a bottom surface of the dielectric polymer and the top surface of the substrate.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
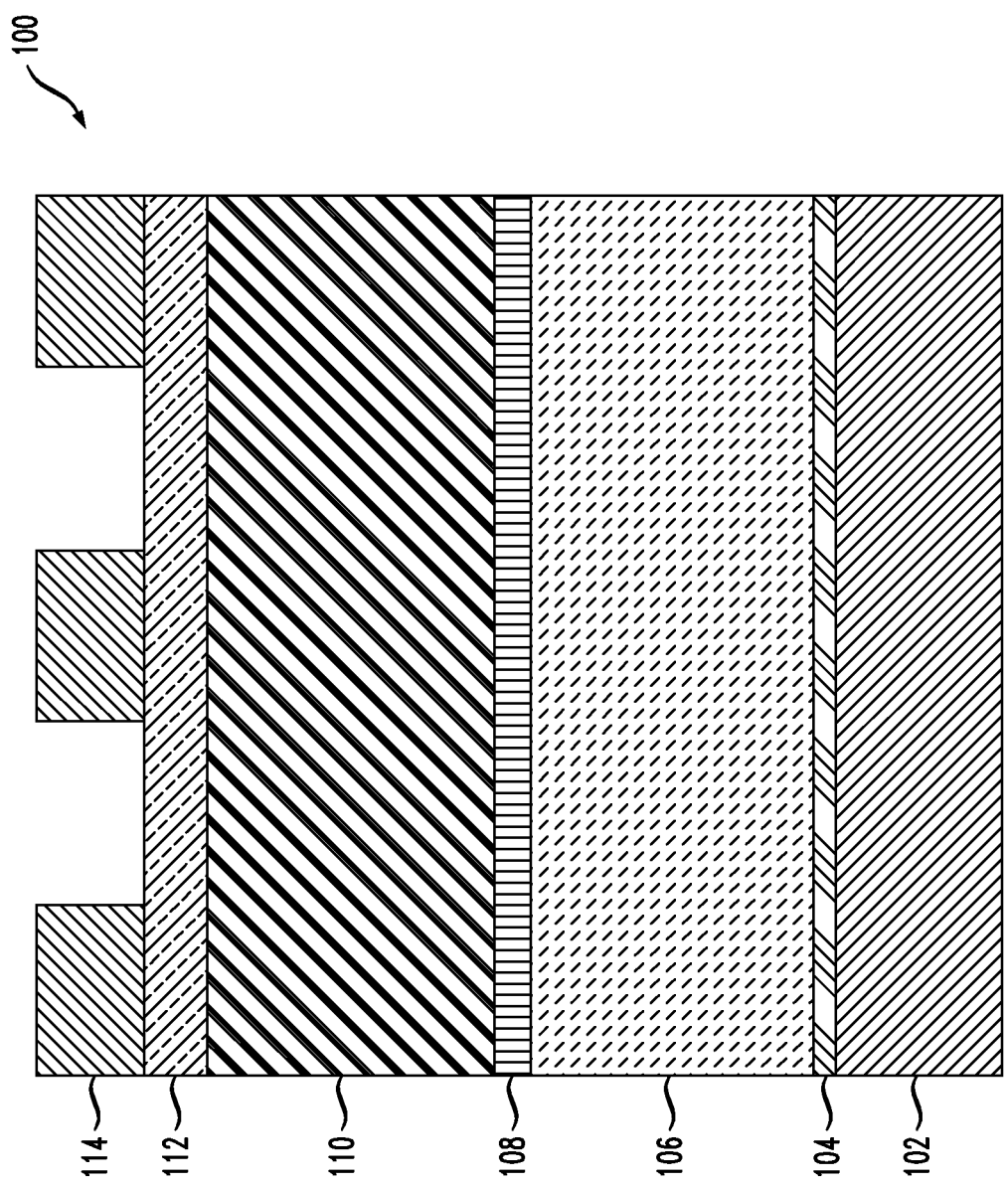
FIG. 1 is a cross-sectional view illustrating a semiconductor structure at a first-intermediate fabrication stage, according to an illustrative embodiment.

This disclosure relates generally to integrated circuits (IC), and more particularly to semiconductor ICs, and methods for their construction.

Exemplary embodiments of the invention will now be discussed in further detail with regard to integrated circuits and a method of manufacturing the IC, and more particularly to top-via interconnects having an air gap using a selective deposition of a dielectric. Interconnect structures in integrated circuits induce a delay in the propagation of the information between semiconductor devices such as transistors. Introducing air gaps between laterally-spaced top-via interconnects can significantly reduce the parasitic capacitance and the device delay caused by this parasitic capacitance. One common way of introducing air gaps between laterally-spaced top-via interconnects is by pinching off the space between the top-via interconnects with a layer of non-conformal coating. However, depositing this non-conformal pinch-off coating will create unwanted material on the side walls of the metal lines/vias, thereby offsetting the capacitance benefits created by the air gap. Thus, embodiments described herein provide top-via interconnects having an air gap that uses selectively-deposited dielectric polymer as the pinch-off layer. This selectively-deposited pinch off dielectric polymer will deposit on a liner and etch stop layer over the metal conductor and pinch off the top-via interconnect containing both metal lines and vias with minimal dielectric deposition on the side walls of the metal conductor, thereby minimizing any offset to the capacitance benefit created by the air gaps due to unwanted material on metal line side walls.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Illustrative embodiments for forming a semiconductor device will be described below with reference to FIGS. 1-11. Note that the same reference numeral (100) is used to denote the semiconductor structure through the various intermediate fabrication stages illustrated in FIGS. 1-11. Note also that the semiconductor structure described herein can also be considered to be a semiconductor device and/or an integrated circuit, or some part thereof. For the purpose of clarity, some fabrication steps leading up to the production of the semiconductor structure as illustrated in FIGS. 1-11 are omitted. In other words, one or more well-known processing steps which are not illustrated but are well-known to those of ordinary skill in the art have not been included in the figures.

For example, according to a first embodiment, FIG. 1 illustrates a schematic cross-sectional side view of a semiconductor structure 100 for use in forming an interconnect structure. For the purpose of clarity, fabrication steps leading up to the production of semiconductor structure 100 as illustrated in FIG. 1 are omitted. In other words, semiconductor structure 100 does not necessarily start out in the form illustrated in FIG. 1, but may develop into the illustrated structure over one or more well-known processing steps which are not illustrated but are well-known to those of ordinary skill in the art.

As shown in FIG. 1, the semiconductor structure 100 comprises an optional metal nucleation/etch stop layer 104 disposed on the surface of substrate 102 having devices formed therein. Substrate 102 may be a semiconductor chip or wafer which is prepared using conventional techniques well known in the art. Substrate 102 may contain various interconnect regions on the surface thereof. In one embodiment, semiconductor structure including substrate 102 can be, for example, a back-end-of-line (BEOL) interconnect structure which includes a metallization (M1) level and a first via (V1) level.

Figure 5:
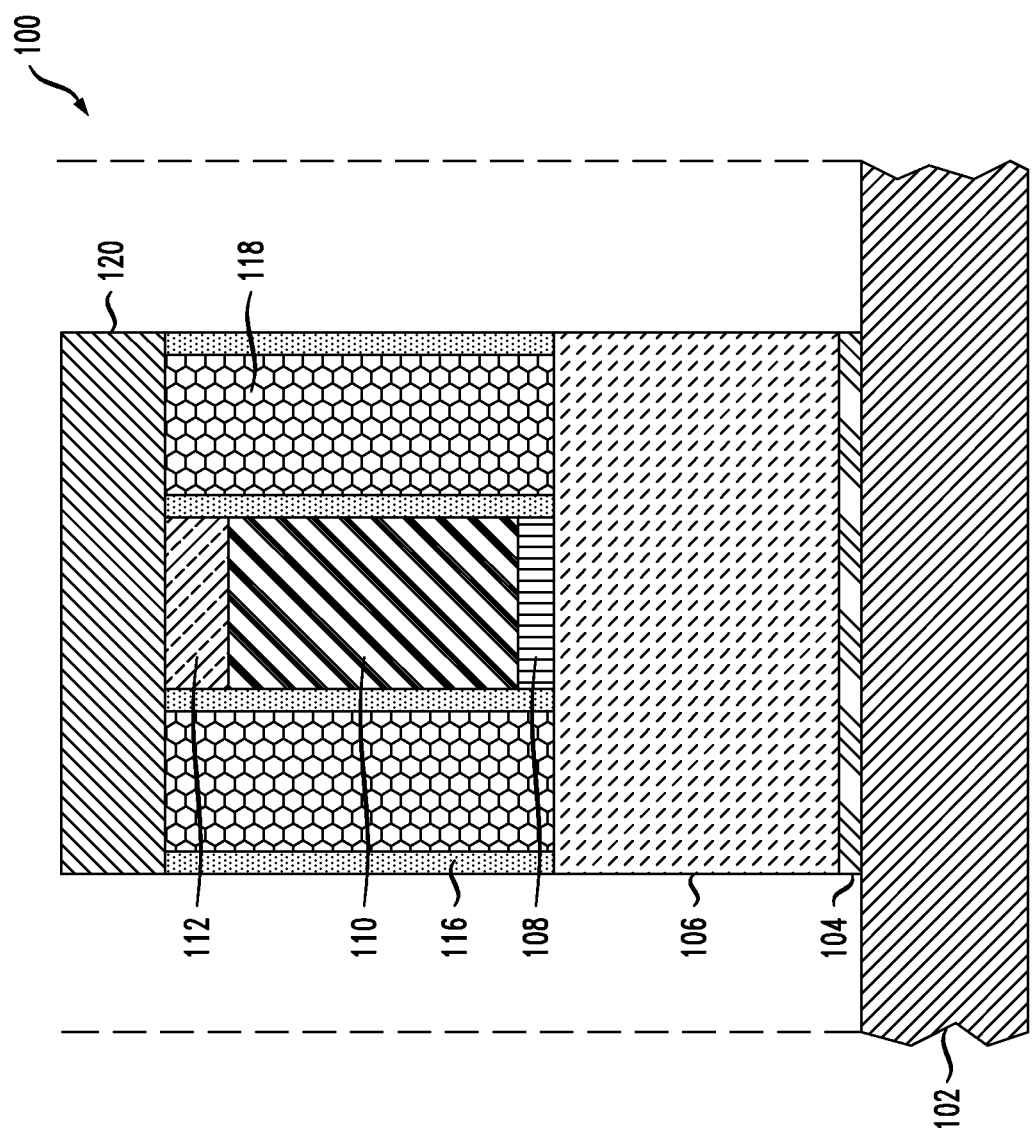
FIG. 5 is a cross-sectional view illustrating the semiconductor structure at a fifth-intermediate fabrication stage, according to an illustrative embodiment.

As one skilled in the art will appreciate, metal nucleation/etch stop layer 104 can be used to assist in the deposition process of the metallization layer 106 discussed hereinbelow when using atomic layer deposition (ALD) or chemical vapor deposition (CVD). When using a physical vapor deposition (PVD) to deposit the metallization layer 106, a metal nucleation/etch stop layer is not necessary on the substrate. Metal nucleation/etch stop layer 104 is also an etch stop layer when etching the metallization layer into line patterns as shown in FIG. 5 in order to prevent the etching process to over etch into the substrate.

Metal nucleation/etch stop layer 104 includes, but is not limited to, TaN, TiN, TiO and WN. The metal nucleation/etch stop layer 104 can be conformally deposited using known methods such as ALD, CVD, PVD, electroplating, or electroless plating. A chemical mechanical planarization (CMP) process can be performed to planarize the structure surface prior to deposition of the metallization layer 106. In general, metal nucleation/etch stop layer 104 can have a thickness ranging from about 0.5 to about 5 nanometers (nm).

A metallization layer 106, i.e., metallization level 1, is deposited on the substrate or optional metal nucleation/etch stop layer 104 using a suitable deposition process, for example CVD, ALD, PVD, plasma enhanced chemical vapor deposition (PECVD), chemical solution deposition or other like processes. Suitable conductive metals for metallization layer 106 are any conductive material that can be dry etched or patterned including, for example, aluminum (Al), chromium (Cr), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. In one embodiment, metallization layer 106 is formed by one or more of Al, Ru, Ta, Ti or W. In one embodiment, metallization layer 106 is Ru.

Next, etch stop layer 108 is deposited on metallization layer 106. As one skilled in the art will understand, etch stop layer 108 will be made of a material with either a higher resistivity or a lower resistivity than the resistivity of metallization layer 106. Suitable materials for etch stop layer 108 include, for example, Ir, TaN, SiN, hydrogen-doped SiN, a nitrogen-doped silicon carbide (e.g., NBloK), etc., although other material suitable in providing etch-stop function may be used as well. The etch stop layer 108 may be formed using known deposition techniques, such as, for example, CVD, PVD, PECVD, ALD, or spin on deposition, followed by a standard planarization process (e.g., CMP) to planarize the upper surfaces. In general, etch stop layer 108 can have a thickness ranging from about 0.5 to about 10 nm.

Dielectric layer 110, i.e., via level V1, is deposited on etch stop layer 108. Dielectric layer 110 may be made of any known dielectric material such as octamethylcyclotetrasiloxane (OMCTS), $SiO_2$, AlOx, SiN, TiN, etc. The dielectric layer 110 may be formed by any suitable deposition technique known in the art, including ALD, CVD, PVD, molecular beam deposition (MBD), pulsed laser deposition (PLD), or liquid source misted chemical deposition (LSMCD).

Hardmask 112 is deposited on dielectric layer 110. Hardmask 112, e.g., SiN, may be formed by any suitable deposition technique known in the art, including ALD, CVD, and PVD. Next, a conventional lithography material 114 such as a photoresist is deposited on hardmask 112 using conventional techniques. The photoresist is then patterned for forming vias in the V1 level as discussed hereinbelow.

Figure 2:
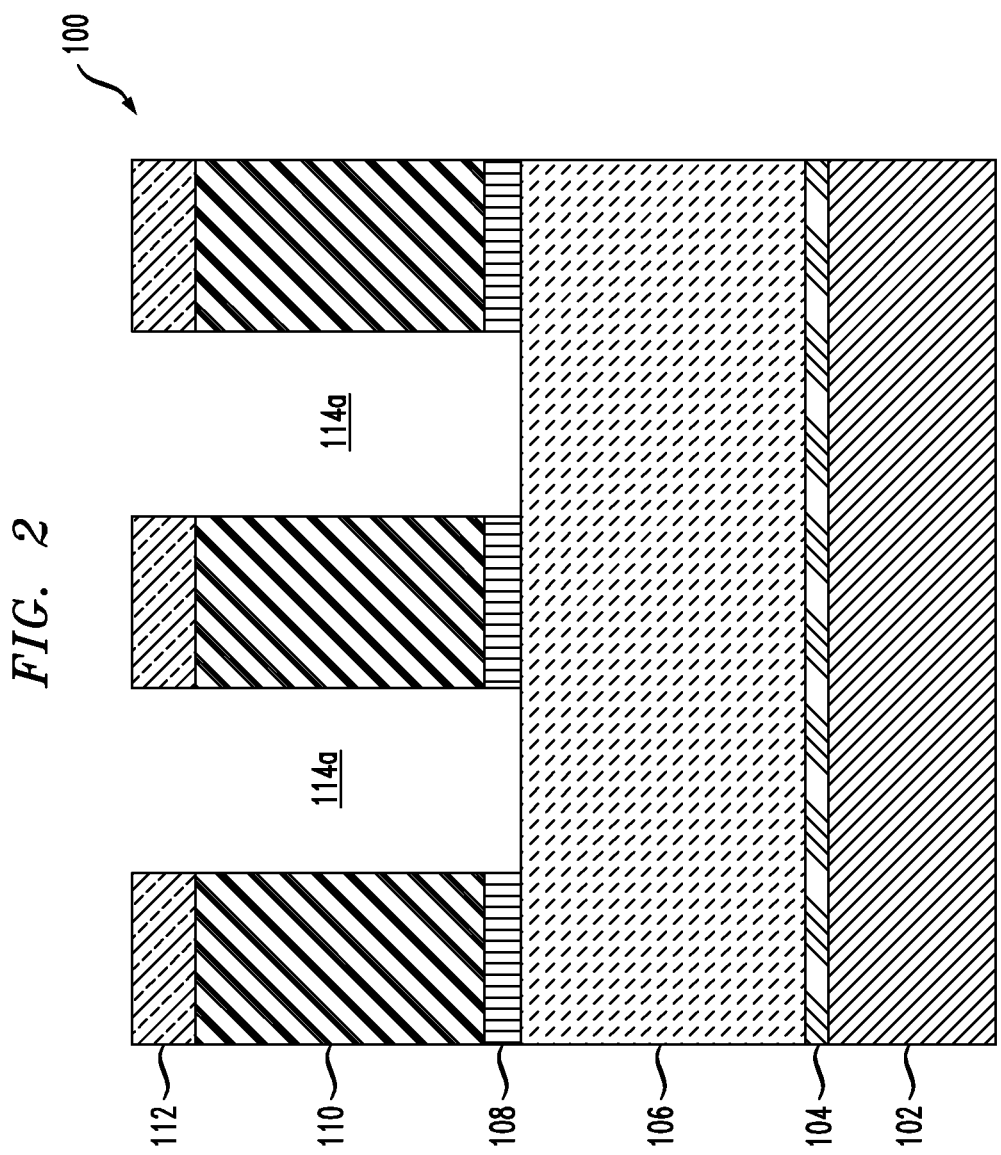
FIG. 2 is a cross-sectional view illustrating the semiconductor structure at a second-intermediate fabrication stage, according to an illustrative embodiment.

FIG. 2 illustrates the semiconductor structure 100 at a second intermediate stage of fabrication after etching via openings 114*a* using the lithography material 114 as a guide. The etch may, for example, comprise a reactive ion etch (RIE) as known to those skilled in the art. As shown in FIG. 2, the via openings 114*a* are extended through hardmask 112, dielectric layer 110 and etch stop layer 108, exposing a top surface of metallization layer 106. The photoresist 114 is completely removed during the etching process. In addition, the etch stop layer 108 is removed from the via openings 114*a* by known RIE or wet etching techniques as shown in FIG. 2.

Figure 3:
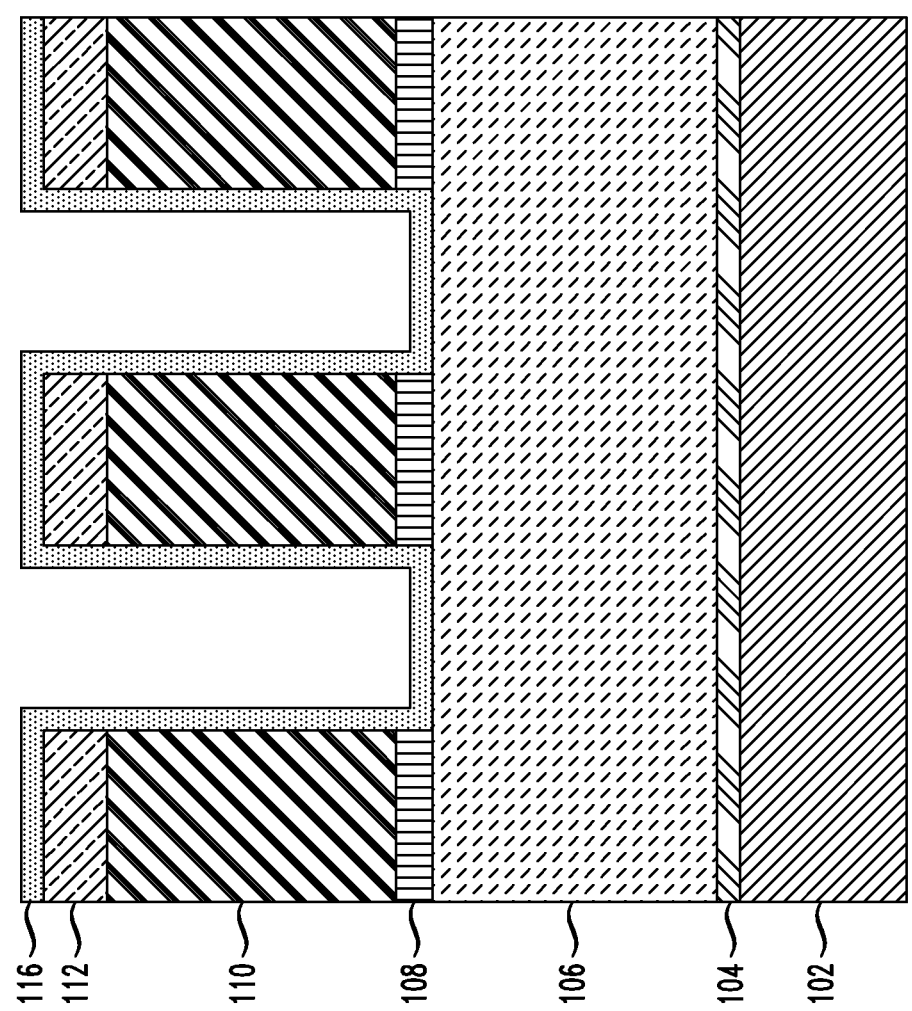
FIG. 3 is a cross-sectional view illustrating the semiconductor structure at a third-intermediate fabrication stage, according to an illustrative embodiment.
Figure 7:
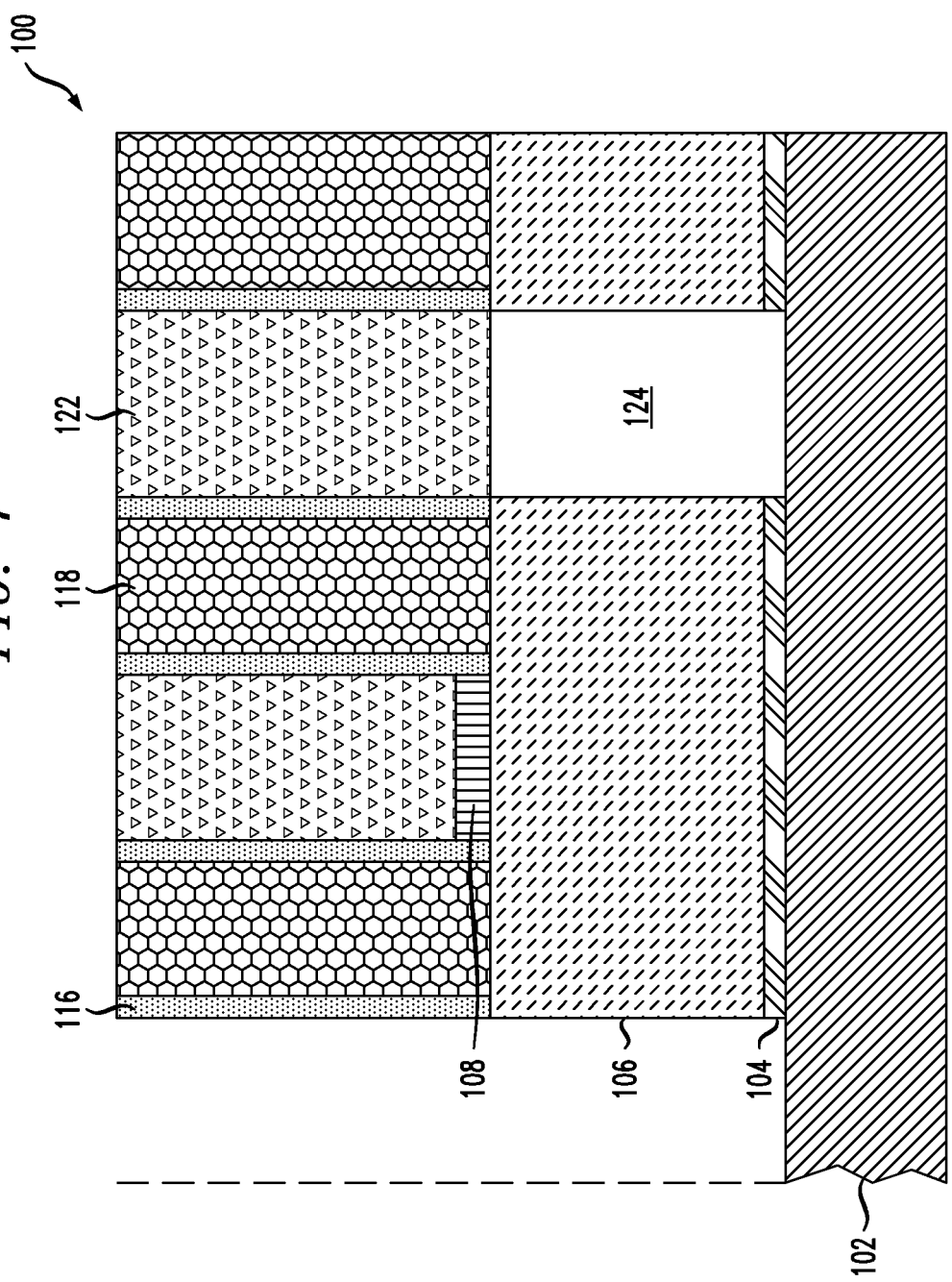
FIG. 7 is a cross-sectional view illustrating the resulting semiconductor structure at a seventh-intermediate fabrication stage, according to an illustrative embodiment.

FIG. 3 illustrates the semiconductor structure 100 at a third intermediate stage of fabrication wherein polymer-adhering liner layer 116 is deposited in via opening 114*a* and on a top surface of hardmask 112. Suitable material used for polymer-adhering liner layer 116 can be any of those material for metal nucleation/etch stop layer 104, for example, a nitride-based material such as TaN, TiN and WN. The polymer-adhering liner layer 116 can be conformally deposited using known methods such as ALD, CVD, PVD, electroplating, or electroless plating. The polymer-adhering liner layer 116 assists in the metal deposition process to fill the vias as discussed below, in the dielectric polymer selective deposition process as shown in FIG. 7. In general, polymer-adhering liner layer 116 can have a thickness ranging from about 0.5 to about 5 nm.

Figure 4:
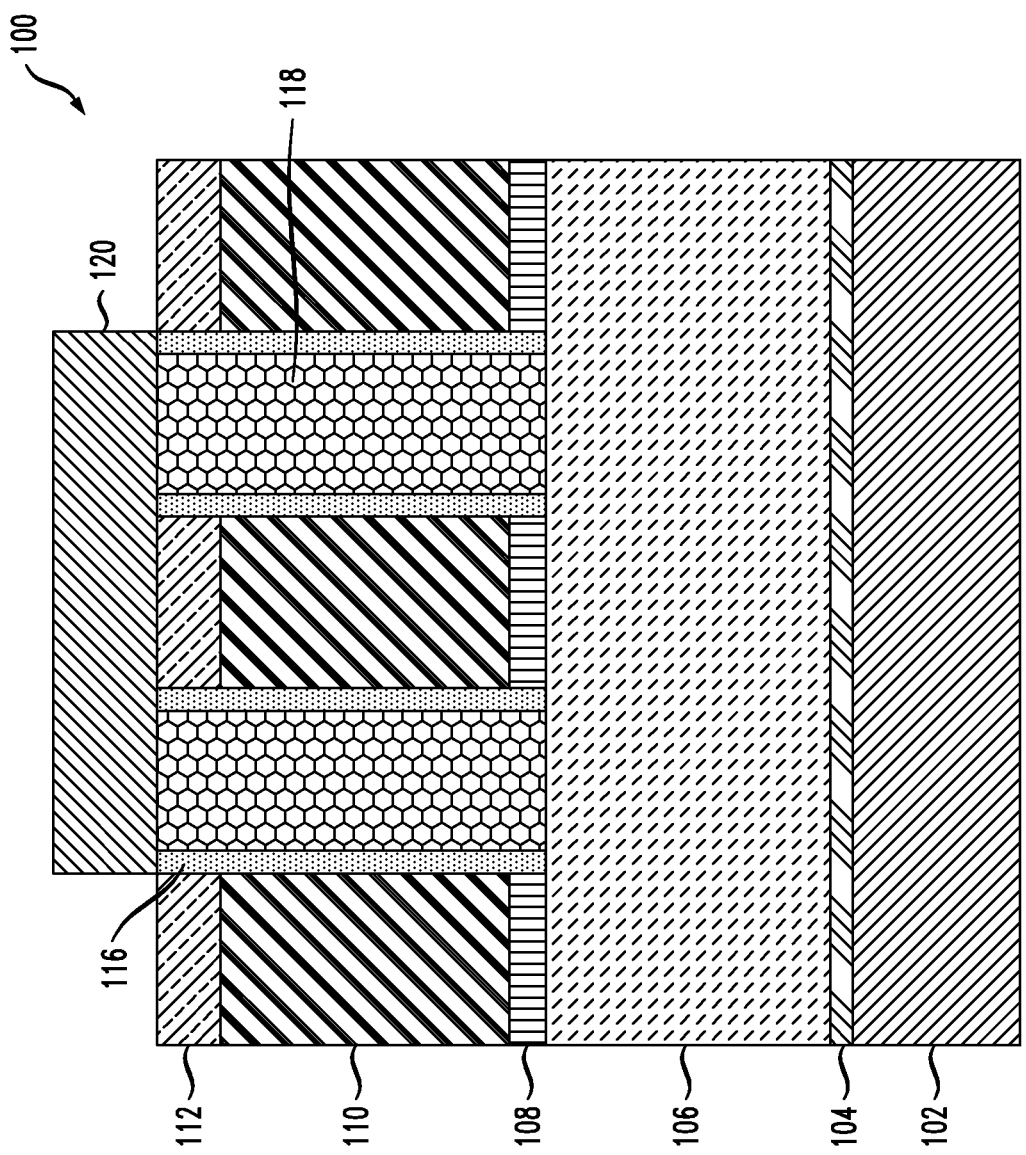
FIG. 4 is a cross-sectional view illustrating the semiconductor structure at a fourth-intermediate fabrication stage, according to an illustrative embodiment.

FIG. 4 illustrates the semiconductor structure 100 at a fourth intermediate stage of fabrication wherein a conductive metal layer 118 is deposited in and fills via openings 114a using known methods such as PVD, electroplating, or electroless plating. Conductive metal layer 118 can be any of the metals discussed above for metallization layer 106. In one embodiment, conductive metal layer 118 is the same as metallization layer 106. Subsequently, any metal overburden of conductive metal layer 118 and the horizontal surfaces of polymer-adhering liner layer 116 are then planarized by, for example, a planarization process such as CMP, exposing the top surfaces of hardmask 112.

Next, semiconductor structure 100 is patterned by depositing a conventional lithography material 120 such as a photoresist on the top surfaces of conductive metal layer 118 and hardmask 112 disposed between adjacent vias using conventional techniques.

FIG. 5 illustrates the semiconductor structure 100 at a fifth intermediate stage of fabrication wherein the exposed hardmask 112 is first removed by conventional techniques. Next, dielectric layer 110, etch stop layer 108, metallization layer 106, and optional metal nucleation/etch stop layer 104 are subsequently removed using one or more directional etching processes such as RIE. As one skilled in the art will understand, other structures for the metallization level M1 and via level 1 not shown in this figure are contemplated to make up the integrated circuit herein and as shown in FIG. 7. A via (not shown) is formed following removal of these layers.

Figure 6:
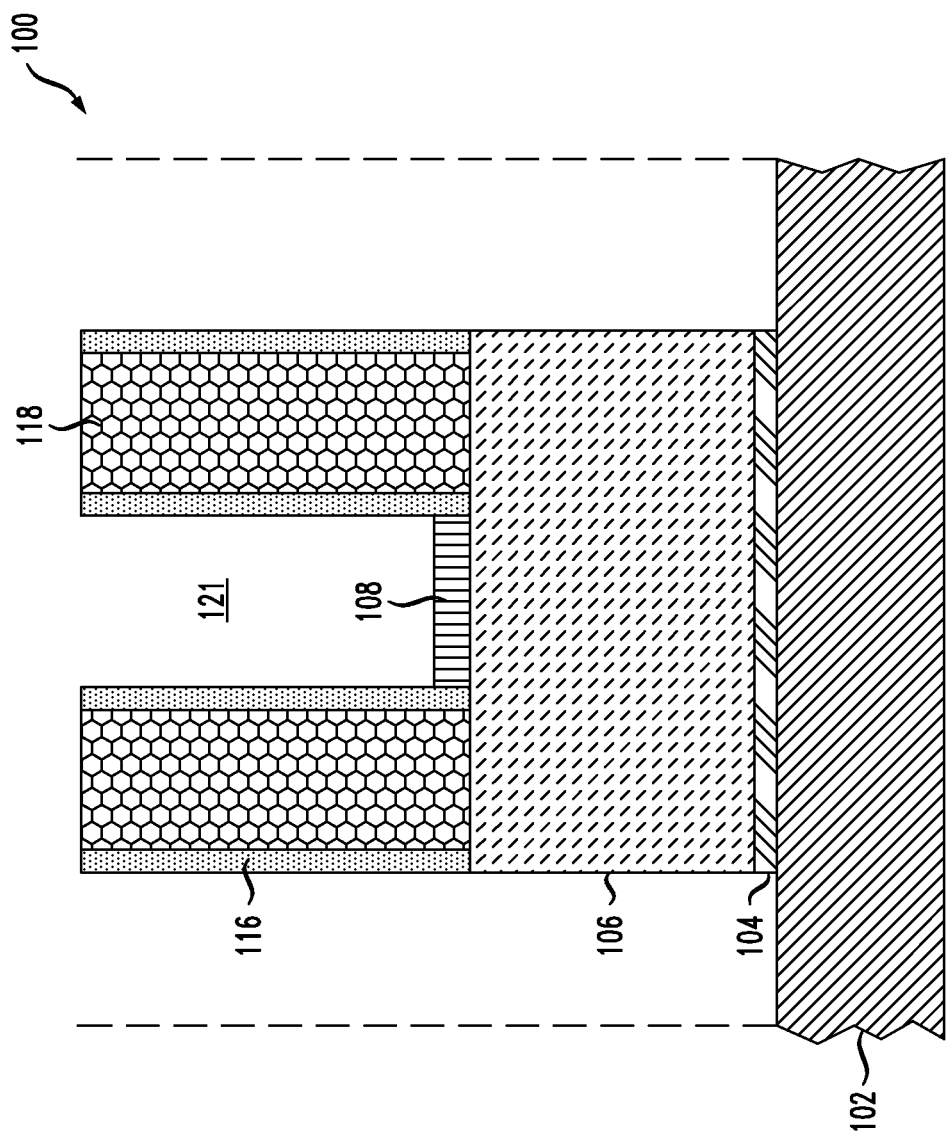
FIG. 6 is a cross-sectional view illustrating the semiconductor structure at a sixth-intermediate fabrication stage, according to an illustrative embodiment.

FIG. 6 illustrates the semiconductor structure 100 at a sixth intermediate stage of fabrication wherein lithography material 120 is first removed from semiconductor structure 100 using conventional techniques. Next, hardmask 112 and dielectric layer 110 are removed using a directional etching process such as RIE to expose a top surface of etch stop layer 108 to form via opening 121.

FIG. 7 illustrates the semiconductor structure 100 in which the resulting structure with air gaps are formed. During this stage, a dielectric polymer 122 is selectively deposited in and fills via opening 121, i.e., dielectric polymer 122 is selectively deposited on polymer-adhering liner layer 116 and etch stop layer 108 in via opening 121. In addition, dielectric polymer 122 is selectively deposited in and fills a top portion of via opening and on polymer-adhering liner layer 116 in the via such that air gap 124 is sealed between the bottom surface of dielectric polymer 122 and the top surface of substrate 102. Air gap 124 may be comprised of a gas from the ambient air, or may be comprised of an inert gas, e.g., nitrogen gas, helium, etc. The dielectric polymer 122 can be, for example, a dielectric such as poly-p-xylylene. For example, the air gap shown in FIG. 7, such as air gap 124, may be formed via a single-step dielectric deposition process in which the dielectric polymer is deposited on the liner layer.

Figure 8:
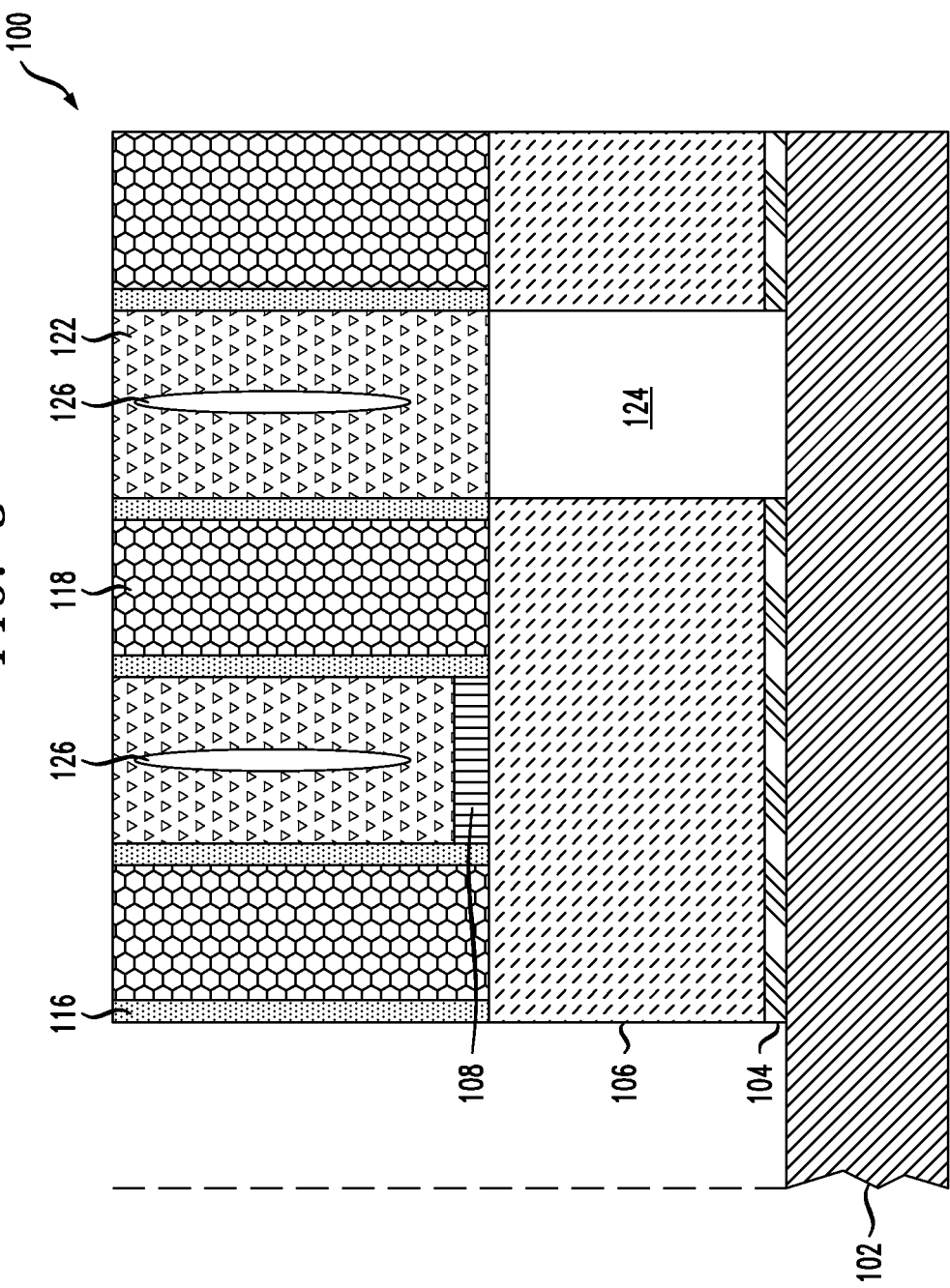
FIG. 8 is a cross-sectional view illustrating of a semiconductor structure at a seventh-intermediate fabrication stage starting from FIG. 6, according to an alternative illustrative embodiment.

FIG. 8 illustrates the semiconductor structure 100 at an alternative intermediate stage of fabrication from FIG. 6 where dielectric polymer 122 is selectively deposited in and fills via opening 121. As discussed above, with the selective deposition of the dielectric polymer 122 on polymer-adhering liner layer 116 in the top portion of via (not shown), air gap 124 is sealed between the bottom surface of dielectric polymer 122 and the top surface of substrate 102. In this embodiment, an additional air gap 126 is formed by being embedded within dielectric polymer 122 when the polymer deposition rate is uneven. Thus, the dielectric polymer will have a greater deposition near the top portion of via opening 121, causing the dielectric polymer in the top portion of via opening 121 to seal off completely and form an air gap within the dielectric polymer.

Figure 9:
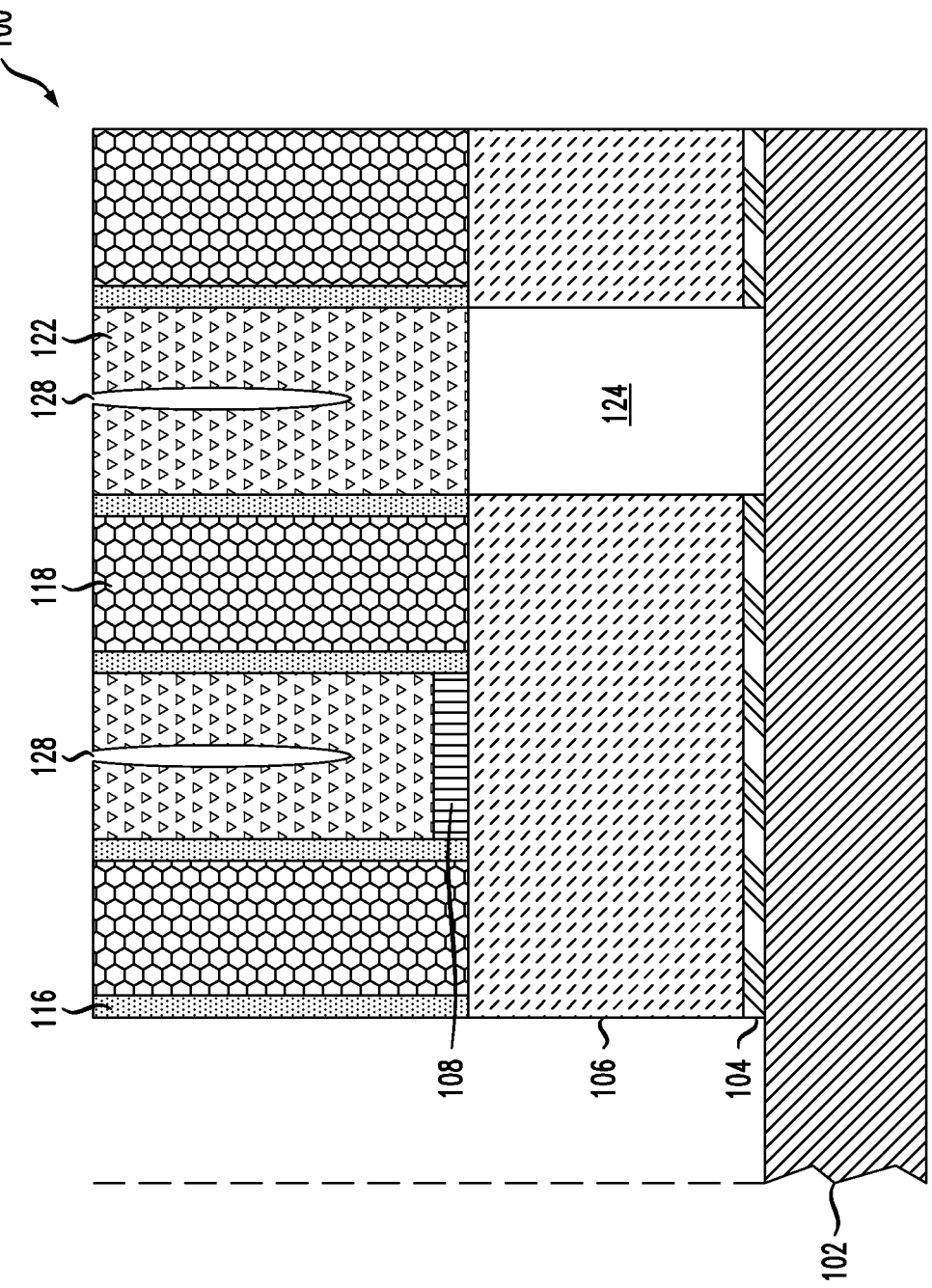
FIG. 9 is a cross-sectional view illustrating a semiconductor structure at a seventh-intermediate fabrication stage starting from FIG. 6, according to an alternative illustrative embodiment.
Figure 10:
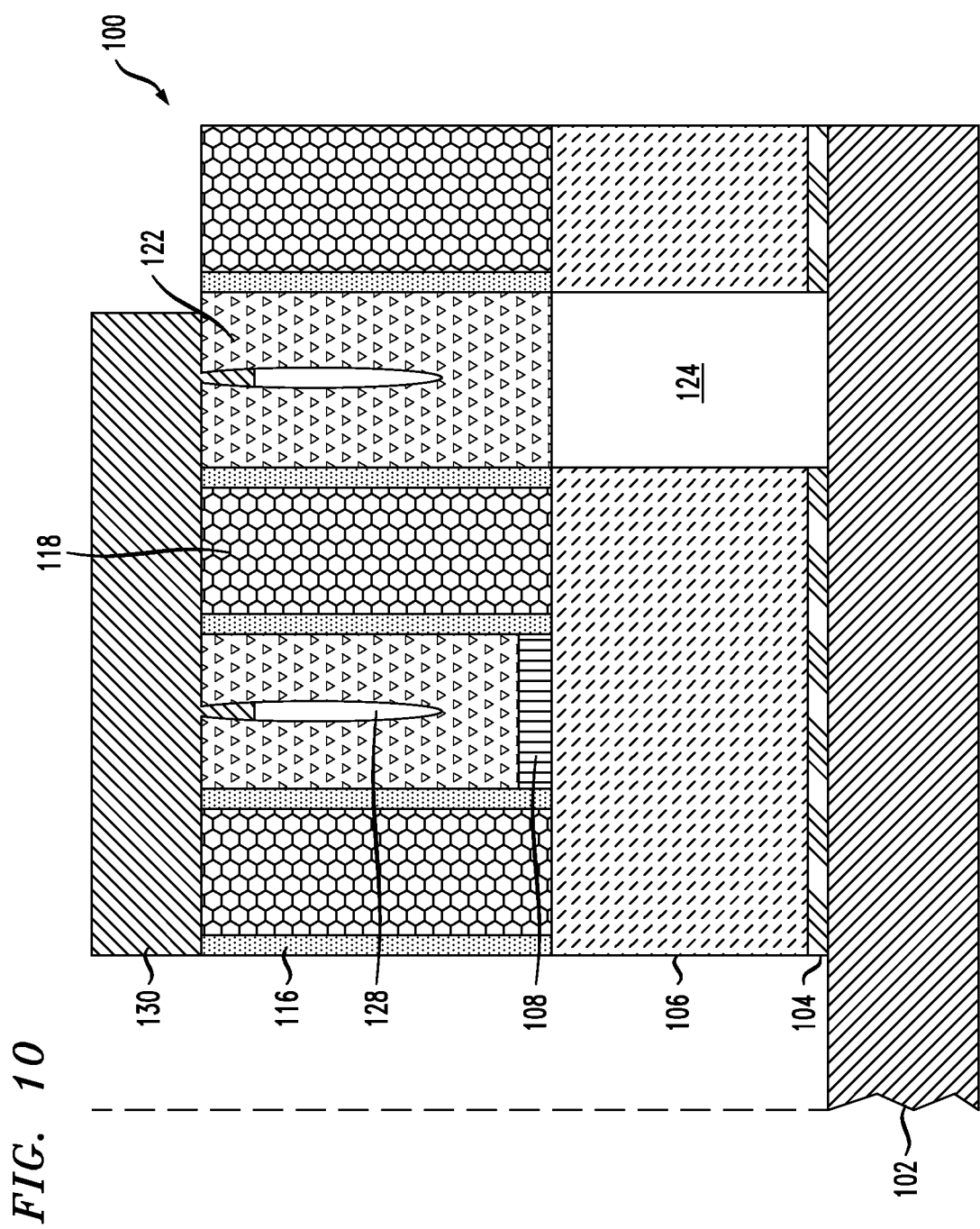
FIG. 10 is a cross-sectional view illustrating the semiconductor structure at an eighth-intermediate fabrication stage from FIG. 9, according to an alternative illustrative embodiment.
Figure 11:
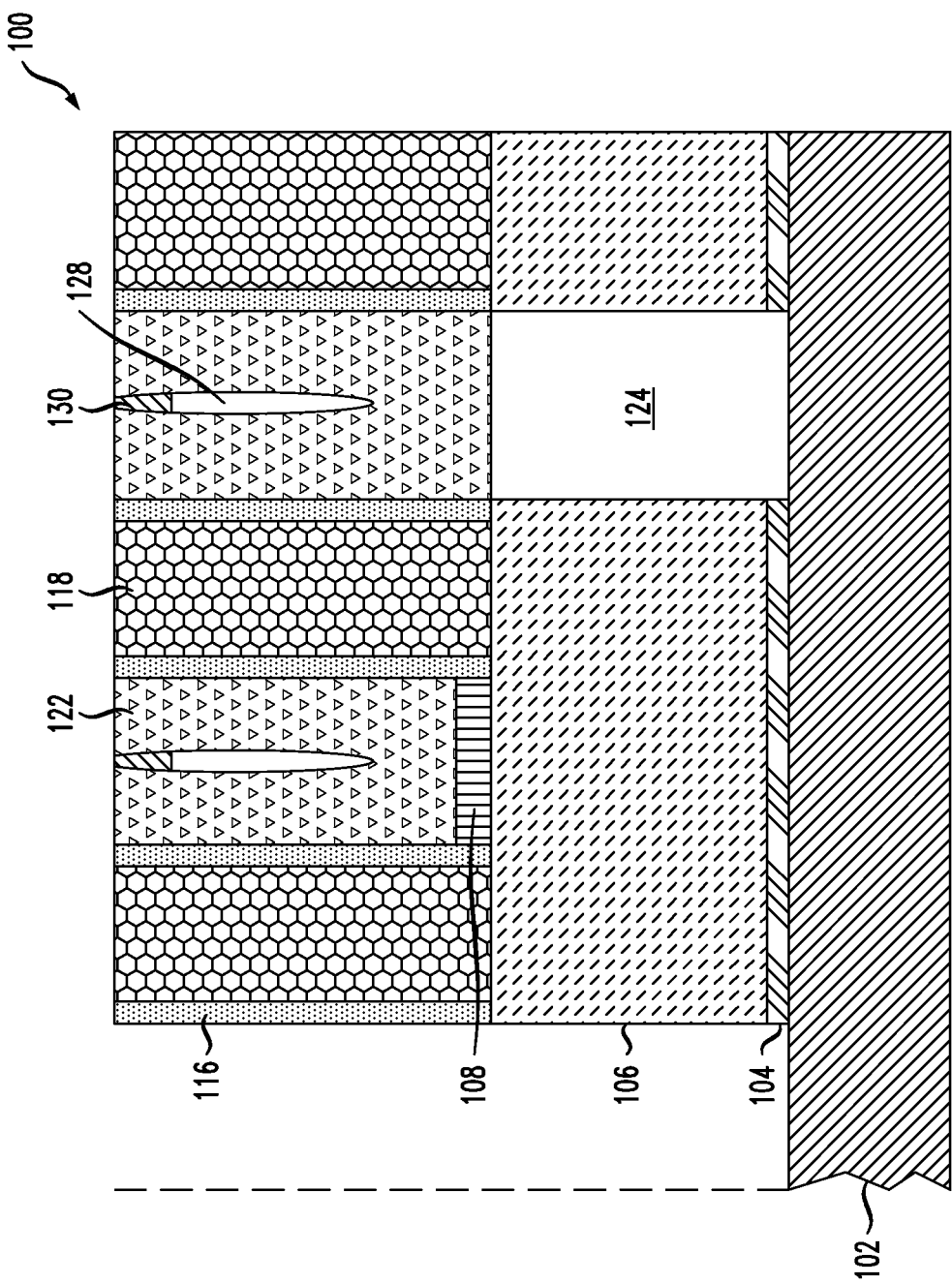
FIG. 11 is a cross-sectional view illustrating the resulting semiconductor structure at a ninth-intermediate fabrication stage from FIG. 10, according to an alternative illustrative embodiment.

FIGS. 9-11 illustrate the semiconductor structure 100 at another alternative intermediate stage of fabrication from FIG. 6. Referring to FIG. 9, dielectric polymer 122 is selectively deposited in and fills via opening 121. Also as discussed above, with the selective deposition of the dielectric polymer 122 on polymer-adhering liner layer 116 in the via (not shown), air gap 124 is sealed between the bottom surface of dielectric polymer 122 and the top surface of substrate 102. In this embodiment, an additional air gap 128 is formed in dielectric polymer 122 and having an opening at the top of air gap 128 when the polymer deposition rate is uneven. Thus, the dielectric polymer 122 will have a greater deposition near the top portion of each of the vias thereby resulting in the dielectric polymer 122 in the top portion of each of the vias to form an air gap within the dielectric polymer 122 and leave an opening at the top of the air gap.

FIG. 10 illustrates the semiconductor structure 100 at an intermediate stage of fabrication wherein barrier layer 130 is deposited on a top surface of semiconductor structure 100 and in a portion of air gap 128, i.e., to fill at least an upper portion of the opening of the dielectric polymer to form a plug and seal an additional air gap positioned between a bottom surface of the plug and a bottom surface of the dielectric polymer in the opening. In one embodiment, barrier layer 130 is deposited on a top surface of semiconductor structure 100 and fills air gap 128. Suitable material for barrier layer 130 includes, for example, a nitrogen-doped silicon carbide (e.g., NBlok), OMCTS, $SiO_2$, AlOx, SiN, SiC, etc. The barrier layer 130 can be conformally deposited using known methods such as ALD, CVD, PVD, electroplating, or electroless plating.

FIG. 11 illustrates the semiconductor structure 100 at another intermediate stage of fabrication wherein barrier layer 130 is removed from the top surface of semiconductor structure 100 leaving barrier layer 130 in at least a portion of air gap 128 and plug the opening. A CMP process is performed to remove the overburden of barrier layer 130, and to planarize the structure surface.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:
1. A semiconductor structure, comprising:
   a substrate;
   a first metallization layer disposed on the substrate;
   a second metallization layer disposed on the first metallization layer and having one or more openings, wherein at least one of the one or more openings is configured to expose a top surface of the first metallization layer;

a polymer-adhering liner layer disposed on sidewalls of the at least one of the one or more openings in the second metallization layer; and a dielectric polymer disposed in the at least one of the one or more openings in the second metallization layer and on the polymer-adhering liner layer, the dielectric polymer being configured to seal an air gap in the dielectric polymer.

2. The semiconductor structure according to claim 1, wherein the dielectric polymer comprises poly-p-xylylene.

3. The semiconductor structure according to claim 1, wherein the substrate comprises a back-end-of-line substrate.

4. The semiconductor structure according to claim 1, wherein the first metallization layer and the second metallization layer are of a same conductive metal.

5. The semiconductor structure according to claim 1, wherein the first metallization layer and the second metallization layer each independently comprise a conductive metal selected from the group consisting of aluminum, ruthenium, tungsten, copper and cobalt.

6. The semiconductor structure according to claim 1, wherein the air gap comprises an opening through a top surface of the dielectric polymer and within a portion of the dielectric polymer; and a plug disposed in the top surface of the dielectric polymer and seals the air gap positioned between a bottom surface of the plug and a bottom surface of the dielectric polymer in the opening.

7. The semiconductor structure according to claim 1, wherein the first metallization layer has one or more openings configured to expose a top surface of the substrate, and at least one other opening of the one or more openings in the second metallization layer is aligned with at least one of the one or more openings in the first metallization layer;

the polymer-adhering liner layer being disposed on sidewalls of the at least one other opening of the one or more openings in the second metallization layer; and the dielectric polymer being disposed in the at least one other opening of the one or more openings in the second metallization layer and on the polymer-adhering liner layer;

wherein the dielectric polymer seals an air gap positioned between a bottom surface of the dielectric polymer and the top surface of the substrate.

8. The semiconductor structure according to claim 7, wherein the dielectric polymer comprises poly-p-xylylene.

9. An integrated circuit comprising one or more semiconductor structures, wherein at least one of the semiconductor structures comprises:

a substrate;

a first metallization layer disposed on the substrate;

a second metallization layer disposed on the first metallization layer and having one or more openings, wherein at least one of the one or more openings is configured to expose a top surface of the first metallization layer;

a polymer-adhering liner layer disposed on sidewalls of the at least one of the one or more openings in the second metallization layer; and a dielectric polymer disposed in the at least one of the one or more openings in the second metallization layer and on the polymer-adhering liner layer, the dielectric polymer being configured to seal an air gap in the dielectric polymer.

10. The integrated circuit according to claim 9, wherein the dielectric polymer comprises poly-p-xylylene.

11. The integrated circuit according to claim 9, wherein the substrate comprises a back-end-of-line substrate.

12. The integrated circuit according to claim 9, wherein the first metallization layer and the second metallization layer are of a same or different conductive metal.

13. The integrated circuit according to claim 9, wherein the air gap comprises an opening through a top surface of the dielectric polymer and within a portion of the dielectric polymer; and a plug disposed in the top surface of the dielectric polymer and seals the air gap positioned between a bottom surface of the plug and a bottom surface of the dielectric polymer in the opening.

14. The integrated circuit according to claim 9, wherein the first metallization layer has one or more openings configured to expose a top surface of the substrate, and at least one other opening of the one or more openings in the second metallization layer is aligned with at least one of the one or more openings in the first metallization layer;

the polymer-adhering liner layer being disposed on sidewalls of the at least one other opening of the one or more openings in the second metallization layer; and the dielectric polymer being disposed in the at least one other opening of the one or more openings in the second metallization layer and on the polymer-adhering liner layer;

wherein the dielectric polymer seals an air gap positioned between a bottom surface of the dielectric polymer and the top surface of the substrate.

15. The integrated circuit according to claim 9, wherein the first metallization layer and the second metallization layer each independently comprise a conductive metal selected from the group consisting of aluminum, ruthenium, tungsten, copper and cobalt.

16. An integrated circuit comprising one or more semiconductor structures, wherein at least one of the semiconductor structures comprises:

a substrate;

a first metallization layer disposed on the substrate and having one or more openings configured to expose a top surface of the substrate;

a second metallization layer disposed on the first metallization layer and having one or more openings configured to align with at least one of the one or more openings in the first metallization layer;

a polymer-adhering liner layer disposed on sidewalls of the one or more openings in the second metallization layer; and a dielectric polymer disposed in the one or more openings in the second metallization layer and on the polymer-adhering liner layer, wherein the dielectric polymer seals an air gap positioned between a bottom surface of the dielectric polymer and the top surface of the substrate.

17. The integrated circuit according to claim 16, wherein the dielectric polymer comprises poly-p-xylylene.

18. The integrated circuit according to claim 16, wherein the substrate comprises a back-end-of-line substrate.

19. The integrated circuit according to claim 16, wherein the first metallization layer and the second metallization layer are of a same conductive metal.

20. The integrated circuit according to claim 16, wherein the first metallization layer and the second metallization layer each independently comprise a conductive metal selected from the group consisting of aluminum, ruthenium, tungsten, copper and cobalt.

* * * * *